US006608308B1

(12) United States Patent
Takagi et al.

(10) Patent No.: US 6,608,308 B1
(45) Date of Patent: Aug. 19, 2003

(54) ELECTROSTATIC LENS SYSTEMS FOR SECONDARY-ELECTRON MAPPING-PROJECTION APPARATUS, AND MAPPING-PROJECTION APPARATUS AND METHODS COMPRISING SAME

(75) Inventors: Toru Takagi, Yokohama (JP); Hiroshi Nishimura, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/580,533

(22) Filed: May 26, 2000

(30) Foreign Application Priority Data

May 26, 1999 (JP) .......................................... 11-145937
May 26, 1999 (JP) .......................................... 11-145938

(51) Int. Cl.[7] ............................. G21K 7/00; G03C 5/00

(52) U.S. Cl. ....................... 250/311; 250/306; 250/307; 430/296

(58) Field of Search ................................ 250/311, 304, 250/306, 307, 310, 396 R, 397, 398, 399

(56) References Cited

U.S. PATENT DOCUMENTS 3,851,172 A * 11/1974 Ozasa et al. ................ 250/311
4,224,518 A * 9/1980 Taylor ........................ 250/305
4,629,898 A * 12/1986 Orloff et al. ............ 250/396 R
4,737,639 A * 4/1988 Rusch ........................ 250/305
5,006,795 A * 4/1991 Yoshizawa et al. ......... 250/310
5,045,705 A * 9/1991 Mollenstedt ................ 250/311
5,187,358 A * 2/1993 Setani ..................... 250/208.1
5,393,983 A * 2/1995 Hosoki ....................... 250/311
5,498,874 A * 3/1996 Miyoshi et al. ............. 250/397
5,644,132 A * 7/1997 Litman et al. .............. 250/310
5,973,323 A * 10/1999 Adler et al. ................ 250/307
6,087,659 A * 7/2000 Adler et al. ................ 250/307
6,157,039 A * 12/2000 Mankos ................... 250/492.2
6,259,094 B1 * 7/2001 Nagai et al. ................ 250/310
2002/0104964 A1 * 8/2002 Adler et al. ................ 250/307

FOREIGN PATENT DOCUMENTS

WO WO 99/23684 * 5/1999 ............ H01J/37/26
WO WO 00/72355 A1 * 11/2000 ............ H01J/37/26

OTHER PUBLICATIONS

M. Born & E. Wolf, "Principle of Optics", Pergamon Press,m Oxford—New York—etc., 5th edition 1975, pp. 186–187.*

* cited by examiner

*Primary Examiner*—John R. Lee
*Assistant Examiner*—Bernard E. Souw
(74) *Attorney, Agent, or Firm*—Klarquist Sparkman LLP

(57) ABSTRACT

Electron-optical systems are disclosed that are especially useful in mapping-projection electron microscopy and related uses. The systems achieve high magnification with excellent control of aberrations, and low magnification at wide optical fields with excellent control of aberrations.

8 Claims, 8 Drawing Sheets

ELECTROSTATIC LENS SYSTEMS FOR SECONDARY-ELECTRON MAPPING-PROJECTION APPARATUS, AND MAPPING-PROJECTION APPARATUS AND METHODS COMPRISING SAME

FIELD OF THE INVENTION

This invention pertains to electrostatic lenses and electrostatic optical systems as used in charged-particle-beam (CPB) 2-D mapping microscopes (e.g., mapping electron microscopes) and related systems for observing a surface of a specimen in two dimensions.

BACKGROUND OF THE INVENTION

A scanning electron microscope (SEM) generally is used for examining the surface of a specimen, such as the product of a step in a process for manufacturing semiconductor integrated circuits, especially to ascertain the presence of surficial defects. In view of the fact that an electron beam is an exemplary charged particle beam, work has been done directed to the use of other charged particle beams (such as a focused ion beam) for similar applications.

Since principles generally applicable to an electron beam are applicable to an ion beam, the discussion below is made in the context of an electron-beam system. However, in view of the above, it will be understood that the invention is not limited to electron-beam systems.

In an SEM, as is generally known, an electron beam is irradiated onto a point on the surface of the specimen being observed. Impingement of the electron beam on the specimen surface causes the surface to emit secondary electrons. The secondary electrons are accelerated away from the surface, collected, and quantified by a suitable detector. To image a region on the sample, the electron beam simply is scanned in two dimensions in a raster manner. Secondary electrons generated at each irradiation point in the scan are collected and quantified. The data collected by the detector are processed to form an image that is displayed on a screen (CRT) or the like.

A main disadvantage of conventional SEMs is the long period of time required for obtaining an image of the surface being observed. The time is related to the need to two-dimensionally scan a point-focused electron beam over the observed surface. As a result, "mapping electron microscopes" are being investigated for use, as a possible alternative to SEMs, in examining semiconductor wafers and chips and in other applications in which high speed is required. This is because a mapping electron microscope offers prospects of simultaneously viewing an entire region of the target surface in two dimensions. To such end, a mapping electron microscope utilizes an electron-optical system (i.e., a system comprising multiple electron lenses) to direct the electron beam onto an area of the sample surface that is larger than a point. Unfortunately, various technical problems remain unresolved with mapping electron microscopes.

One problem concerns the substantial aberration that is encountered whenever a wide visual field is imposed on an electron-optical system. A conventional electron-optical system for use in a mapping electron microscope utilizes multiple electrostatic lenses to achieve a suitably high magnification of the image of the target surface. In such systems, simple Einzel (unipotential) lenses typically are used for all lenses except for the initial (cathode) lens. However, with such lenses, suitably large fields cannot be obtained because large fields produce serious aberrations.

With simple Einzel lenses, image-degrading aberrations can be reduced somewhat by forming the image using two lenses. However, such a configuration cannot produce the desired high image magnification.

More specifically, whenever high-magnification enlargement and projection are performed using electrostatic lenses, a simple short-focal-length (f) lens may be situated an axial distance (f+dz), wherein dz<<f, to the rear of the object plane or of an intermediate imaging plane. However, if the voltage applied to the electrostatic lens is increased, the field intensity within the lens increases and f shortens. If the impressed voltage is excessive, a potential barrier is formed that exceeds the kinetic energy of the electrons in the beam. In such a condition, the electrons are repelled by the lens and the desired lensing action is not obtained.

At a given impressed voltage to an electrostatic lens, the focal length f can be shortened simply by making the lens smaller. However, this approach is problematic in that there are practical limitations on the spacing between adjacent electrodes of the lens. These limitations mainly concern, for example, breakdown voltages between the electrodes. Also, off-axis aberrations tend to be excessive whenever small electrostatic lenses are used that have narrow on-axis fields. Therefore, it has been difficult to construct short-f electrostatic lenses that exhibit acceptably reduced aberrations.

Conventional approaches that achieve increased magnification by multi-stage imaging, especially in systems comprising multiple axially aligned simple Einzel lenses, have other problems. For example, whenever an electron beam passes through a lens located remotely downstream, portions of the beam pass through extreme off-axis regions of the lens. In such situations, even though aberrations could be suppressed adequately by making the remote lens extremely large, this approach is impractical. Alternatively, the electron-optical system is made extremely long in the axial direction so as to achieve high magnification with adequate suppression of aberrations. The great length of such a system is a serious disadvantage.

In other types of conventional electron-beam mapping-projection apparatus, as shown in FIG. 9, an "E cross B" ("ExB"; sometimes also termed a Wien filter) 42 is used to achieve perpendicular irradiation of the target surface 44 with an electron beam passing through an "irradiation column" 41. Secondary electrons emitted from the target surface 44 are routed through a "projection system" PL having an optical axis AX that is perpendicular to the target surface 44. More specifically, the "irradiation beam" (having a predetermined transverse area) approaches the ExB 42 along an axis Al that is angled relative to an optical axis AX. The irradiation beam is directed to the optical center of the ExB 42. Upon passing through the ExB 42, the irradiation beam propagates along the optical axis AX through a front lens 43 to the target surface 44 to "down-illuminate" (irradiate) the target surface at a zero angle of incidence. Secondary electrons emitted by the target surface 44 return along the optical axis AX through the front lens 43 and pass straight through the ExB 42 without being deflected. Upon passing through the front lens 43, the secondary electrons form a first intermediate image at a first intermediate-imaging plane Ml situated at the optical center of the ExB 42. An aperture 45 is provided to decrease aberrations in the first intermediate image.

From the ExB 42, the beam of secondary electrons enters the projection system PL. The projection system PL comprises first and second projection lenses 46, 47, respectively. An image of the first intermediate image is formed, as a second intermediate image, at a second intermediate-imaging plane M2 by the first projection lens 46. An image of the second intermediate image is formed on a detector surface (imaging surface) 48 by the second projection lens 47. The overall magnification of the image on the detector surface 48 can be varied in a continuous manner (i.e., "zoomed") by varying the electrical energy supplied to the first projection lens 46, which varies the position of the second intermediate-imaging plane M2.

The first intermediate-imaging plane M1 is located at the optical center of the ExB 42 to eliminate, in a substantial manner, chromatic aberrations of the ExB 42 arising from its function as a conventional Wien filter, and to eliminate, in a substantial manner, the astigmatism that is characteristic of ExBs.

Unfortunately, a secondary-electron mapping-projection system such as that shown in FIG. 9 has key disadvantages. First, the axis distance between the ExB 42 and any lenses downstream of it must be very large. As noted above, aberrations caused by the ExB 42 can be reduced by situating the first intermediate imaging plane M1 at or near the optical center of the ExB. However, for example, when enlargement projection is performed using a single projection lens downstream of the ExB 42, since the distance between the lens and the first intermediate imaging plane M1 is large, the overall axial length required to form the image is extremely long. Also, image "zooming" (continuous change in magnification) cannot be performed because the first intermediate imaging plane M1 is fixed.

The conventional manner of solving this problem is to insert multiple projection lenses between the imaging plane M1 and the surface of the detector 48, as shown in FIG. 9. This allows the second intermediate imaging plane M2 to be shifted ("zoom" arrow) within a limited range along the axis AX to achieve certain high magnifications. However, off-axis aberrations are increased unacceptably when attempting to use such a configuration to view the target surface in a wide-field, low-magnification range. I.e., under the latter conditions, a principal ray P (solid line) propagates divergently through the first intermediate image plane M1 and thus enters the first projection lens 46 far off-axis (due to the long axial distance between the ExB 42 and the first projection lens 46). This situation causes an unacceptable increase in off-axis aberrations such as pincushion distortion. Also, whenever an image at the first intermediate imaging plane M1 is enlarged by the projection lenses 46, 47 and formed on the surface of the detector 48, the principal ray P incident divergently off-axis to the second projection lens 47 passes through that lens, thereby increasing pincushion distortion.

SUMMARY OF THE INVENTION

In view of the shortcomings of conventional mapping-projection-optical systems, as summarized above, an object of this invention is to provide electrostatic lens systems and mapping-projection systems comprising such lenses that achieve high magnification with excellent control of aberrations, even when the length of the optical system is relatively short and the optical field is wide.

Another object is to provide, for secondary electrons, mapping-projection-optical systems including a beam separator (e.g., an ExB), in which systems distortions are controlled over a wide optical field and that provide a zooming range from low to high magnification while maintaining excellent imaging quality.

To such ends and according to a first aspect of the invention, electrostatic projection-lens systems are provided for secondary-electron mapping-projection apparatus. One embodiment of such a system comprises at least five electrodes arranged along an optical axis. The at least five electrodes comprise a middle electrode, a front-power group disposed axially upstream of the middle electrode and including at least one front electrode, and a rear-power group disposed axially downstream of the middle electrode and including at least one rear electrode. Each power group includes at least one electrode that functions as a respective lens so as to contribute a front power and rear power, respectively, to an overall power of the projection-lens system. Each of the front and rear powers is independently variable.

In such a configuration in which the front and rear powers are independently variable, e.g., the electrodes of the rear power can be used as an imaging lens and the electrodes of the front power can be used for controlling the principal ray so that the ray trajectory extends paraxially (along the optical axis near the center of the deflectors of the rear power). With such a configuration, distortion aberrations are minimized even in a wide optical field.

No distortion is produced in an optical system in which the principal ray intersects the axis at the front nodal point of the system (the front nodal point is the same as the principal point of the system if the system is surrounded on both sides by a medium having the same refractive index). Barrel distortion is produced if the principal ray intersects the axis closer to the object plane than the front nodal point, and pincushion distortion is produced if the principal ray intersects the axis closer to the image plane of the system than the front nodal point. Distortion aberrations can be reduced if a field lens is placed at an intermediate imaging position. The configuration of the principal ray incident to the optical system is controlled by adjusting the power of the field lens.

Upon applying these principles to an electrostatic imaging lens, under conditions in which distortions are not produced, the principal ray at any particular field angle intersects the axis near the center (principal point or nodal point) of the imaging lens (principal point=nodal point). Aberrations can be well suppressed even if an electrostatic imaging lens is used that is smaller and has a narrower paraxial field than usual. Hence, small electrostatic lenses can be used even when higher-magnification enlargement projection is desired, allowing focal lengths to be reduced further. The incidence of the principal ray to the imaging lens is controlled using a field lens (corresponding to the front power). With such a configuration, aberrations are minimized and high magnification is obtained even when using a small electrostatic imaging lens to image a wide optical field.

Desirably, the potential of the front-most electrode (in the front-power group) and the potential of the rear-most electrode (in the rear power group) are at ground potential. The middle electrode is optionally, not necessarily, at ground potential. If the respective potentials of the front-most and rear-most electrodes and the potential of the middle electrode all are equal, then a configuration and lens action are achieved that are the same as if two Einzel lenses were combined. If the front-most, rear-most, and middle electrodes are not all at ground potential, then a bi-potential lens assembly can be realized by varying the respective potentials supplied to these electrodes. Hence, it is possible, for example, to place the center of the front power and the center of the rear power closer to the middle electrode than their respective actual electrode positions.

In the projection-lens system summarized above, at least one of the front and rear power groups can include, in combination with the middle electrode, at least four electrodes. In such a configuration, each of the front and rear powers has a respective center position. The respective center position of at least one of the front and rear powers is varied by varying a respective voltage applied to the respective electrode.

In a configuration in which the front power group includes at least four electrodes, it is possible to vary the front power and its center position independently by adjusting the voltages impressed on at least two electrodes of the group that function as respective lenses. By adjusting the center of the front power so as to place this center at an intermediate image plane formed by a lens system located axially upstream of the subject projection-lens system, the principal ray can be made to intersect the optical axis near the center of the rear power simply by adjusting the front power. If (1) the position of the intermediate image plane is changed by the upstream lens system, (2) the respective voltages impressed on the two (or more) electrodes are adjusted so that the center of the front power remains at the intermediate image plane and the principal ray intersects the optical axis near the center of the rear power, then image magnification can be varied continuously ("zoomed") over a desired range.

In a configuration in which the rear power includes at least four electrodes, it is possible to vary the rear power and its center position independently by adjusting respective voltages impressed on at least two electrodes serving as respective lenses. Varying the position of the center of the rear power is equivalent to varying the position of an imaging lens, whereby the image magnification can be varied continuously. Also, by varying the center position of the rear power in addition to varying the center position of the front power, the principal ray can be controlled so that it always intersects the optical axis in the vicinity of the center of the rear power. This configuration provides great flexibility in changing image magnification while controlling aberrations.

At least one electrode in the front-power group can be configured as a multi-pole electrode including at least four poles. Such a configuration is especially useful for reducing astigmatism whenever a beam separator (e.g., an ExB) is used to convey down-lighting irradiation to the specimen surface. I.e., in a configuration including a beam separator, the angle of the principal ray at the intermediate imaging plane can be different depending upon the orientation of the principal ray in the transverse (x-y) plane orthogonal to the optical axis. Under such conditions, a quadrupole facilitates placement of the principal ray so as to intersect the optical axis at or near the center of the rear power in all directions of the transverse plane. To such end, the quadrupole can vary the deflection angle, within the transverse plane, of the principal ray as achieved by the front power.

It is desirable, in an electrostatic projection-lens system as summarized above, that the center of the front power be situated at or nearly at the intermediate imaging plane. Normally, in order for the principal ray to intersect the optical axis near the center of the rear power, it generally is necessary to adjust the upstream lens system at the same time as the front power is adjusted. However, if the center of the front power is situated at or nearly at the intermediate imaging plane, then the principal ray can be made to intersect the optical axis near the center of the rear power simply by adjusting the front power, thereby greatly simplifying adjustment.

The phrase "at or nearly at" the intermediate imaging plane means that it is not necessary that the center of the front power be situated exactly at the intermediate imaging plane. The center can positioned, within a predetermined tolerance, at the intermediate imaging plane, wherein the tolerance is dictated by design parameters such as permissible aberration level, etc. The magnitude of the tolerance can be determined readily by persons of ordinary skill in the relevant art.

According to another aspect of the invention, secondary-electron mapping-projection apparatus are provided that comprise a projection-lens system as summarized above. A mapping-projection apparatus according to this aspect provides good aberration control at high magnification and with a large optical field with a relatively small axial configuration.

According to another aspect of the invention, methods are provided for performing secondary-electron mapping-projection microscopy, in which an image of a specimen surface is formed at a pre-determined magnification. In one embodiment of such a method, an electrostatic projection-lens system is provided that comprises at least five electrodes arranged along an optical axis. The at least five electrodes comprise a middle electrode, a front-power group disposed axially upstream of the middle electrode and including at least one front electrode, and a rear-power group disposed axially downstream of the middle electrode and including at least one rear electrode. Each power group includes at least one electrode contributing a front power and rear power, respectively, to an overall power of the projection-lens system, and each of the front and rear powers is independently variable. A region of the specimen surface is irradiated with a charged particle beam so as to cause the specimen surface to emit secondary electrons. The secondary electrons are routed into an end of the projection-lens system. At least one of the front power and rear power is adjusted to obtain an electron-image of the irradiated region of the specimen surface at a desired magnification.

According to yet another aspect of the invention, secondary-electron mapping-projection apparatus are provided. One embodiment of such an apparatus comprises, along an optical axis perpendicular to a specimen surface, a beam separator (e.g., an ExB), a front lens system, a projection-lens system, and an imaging surface. The beam separator is situated and configured to cause an irradiation charged particle beam, incident to the beam separator from an off-axis source, to propagate along an optical axis to a specimen surface such that the irradiation beam is incident perpendicularly to the specimen surface. The irradiation beam has an energy sufficient to cause the specimen surface to emit secondary electrons. The front lens system is situated along an axis between the beam separator and the specimen surface. The front lens system is configured bi-directionally telecentrically and is configured to form the secondary electrons into a beam that propagates along the axis from the specimen surface and forms an intermediate image of the irradiated surface at an intermediate image plane at an optical center of the beam separator. The projection-lens system is situated axially between the beam separator and the imaging surface. The projection-lens system is configured to cause the beam of secondary electrons to propagate along the axis and form an image of the intermediate image on the imaging surface.

By providing the front lens system with a substantially bi-directionally telecentric configuration, a principal ray will be incident to a first lens of the projection-lens system without any divergence. Thus, aberrations (e.g., distortions) can be reduced even when performing wide-field imaging. In addition, the bi-directionally telecentric aspect of the front lens system prevents peripheral light dampening of the specimen surface, thereby allowing viewing with uniform brightness.

The phrase "substantially bi-directionally telecentric" means that exact bidirectional telecentricity is not required. Actual telecentricity can vary slightly from exactness so long as actual aberrations are maintained within allowable ranges. The allowable ranges are determined easily by a person of ordinary skill in the relevant art.

Another embodiment of a secondary-electron mapping-projection apparatus according to the invention comprises, along an optical axis perpendicular to a specimen surface, a beam separator (e.g., an ExB), a front lens system, and a rear lens system. The beam separator is situated and configured to cause an irradiation charged-particle beam, incident to the beam separator from an off-axis source, to propagate along the optical axis to the specimen surface. The irradiation beam has an energy sufficient to cause the specimen surface to emit secondary electrons. The front lens system is situated along an axis between the beam separator and the specimen surface, and is configured to form the secondary electrons into a beam that propagates along the axis from specimen surface and forms a first intermediate image of the irradiated surface at an optical center of the beam separator. The rear lens system is situated axially between the beam separator and an imaging surface. The rear lens system comprises a relay optical system and a projection lens. The relay optical system includes multiple lenses configured to cause the beam of secondary electrons to form a second intermediate image at a second intermediate image plane located along the axis downstream of the first intermediate image plane. The projection lens is further configured to cause the beam of secondary electrons from the second intermediate image plane to propagate further downstream along the axis and form an image of the second intermediate image on the imaging surface.

By providing the rear lens system with a relay optical system (comprising multiple lenses) upstream of the projection lens, divergence of the principal ray is suppressed in the relay optical system. As a result, the second intermediate image can be formed in the relay optical system while correcting distortion aberrations. Also, zooming can be achieved by changing the axial position of the second intermediate image in a continuous manner. Desirably, the relay optical system is a full-magnification system that is substantially bi-directionally telecentric near the wide-angle end of its zoom range. This configuration is useful for further decreasing aberrations.

Yet another embodiment of a secondary-electron mapping-projection apparatus according to the invention includes a beam separator (e.g., an ExB) as summarized above. The apparatus also includes a front lens system situated along an axis between the beam separator and the specimen surface. The front lens system has a substantially bi-directionally telecentric configuration, and is further configured to form the secondary electrons into a beam that propagates along the axis from specimen surface and forms an intermediate image of the irradiated surface at an intermediate image plane at an optical center of the beam separator. The apparatus also includes a rear lens system that is situated axially between the beam separator and the detector. The rear lens system comprises a relay optical system and a projection lens. The relay optical system includes multiple lenses configured to cause the beam of secondary electrons to form a second intermediate image at a second intermediate image plane located along the axis downstream of the first intermediate image plane. The projection lens is configured to cause the beam of secondary electrons, from the second intermediate image plane to propagate further downstream along the axis and form an image of the second intermediate image on the imaging surface.

This embodiment includes characteristics of the other two apparatus embodiments summarized above. Specifically, the front lens system is substantially bi-directionally telecentric, which causes the principal ray to be incident to a first lens of the rear lens system without any divergence. Hence, aberrations (including distortions) are suppressed even in wide-field imaging. Also, the relay optical system includes at least two lenses situated upstream of the projection lens. With this configuration, an intermediate image can be formed in the relay optical system while correcting distortions. Also, zooming can be achieved by changing the axial position of the intermediate image in a continuous manner. Thus, the advantages of the bidirectional telecentricity of the front lens system are combined with the advantages of the relay optical system in the rear lens system.

The foregoing and additional features and advantages of the invention will be more readily apparent from the following detailed description, which proceeds with reference to the accompanying drawings.

DETAILED DESCRIPTION

This invention is described below in the context of multiple representative embodiments. However, it will be understood that the invention is not limited to these embodiments. Also, although these embodiments are described in the context of electron-beam systems, it will be understood that the general principles disclosed herein can be applied readily to charged-particle-beam (CPB) systems in general.

Representative Embodiment 1

Figure 1:
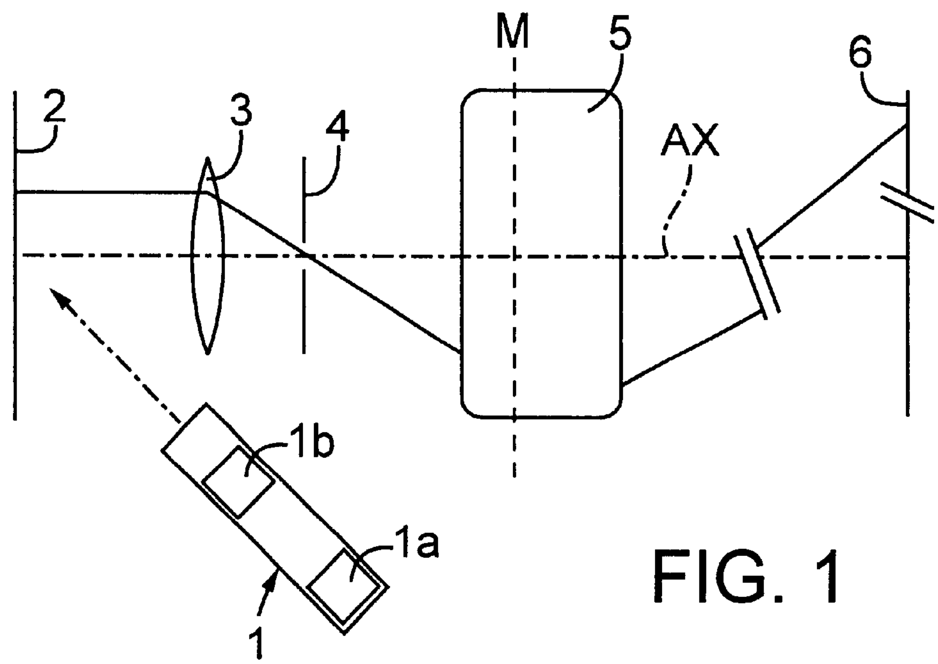
FIG. 1 is a schematic optical diagram of a first representative embodiment of a secondary-electron mapping-projection apparatus according to the invention.

FIG. 1 schematically depicts this embodiment of a secondary-electron mapping-projection apparatus. The components shown include an irradiation source 1, a specimen surface 2, a cathode lens 3, an aperture 4, a projection-optical system 5, and an imaging surface 6 (e.g., surface of a detector). An intermediate imaging plane is denoted by "M", and the axis of the projection-optical system 5 is denoted by "AX."

The irradiation source 1 comprises an electron gun 1*a* and an electrostatic illumination-lens system 1*b* as its main elements. The irradiation source 1 irradiates the specimen surface 2 with an electron beam having a predetermined energy and beam current. Secondary electrons emitted from the specimen surface 2 are accelerated by an electric field formed between the specimen surface 2 and the cathode lens 3. An image of the specimen surface 2, as carried by the secondary electrons, is enlarged several-fold by the cathode lens 3 and formed at the intermediate imaging plane M inside the projection-optical system 5. The aperture 4 serves to minimize aberrations at the intermediate imaging plane M. The image of the specimen surface 2 formed at the intermediate imaging plane M is further enlarged by the projection-optical system 5, and a final image is formed on the imaging surface 6. The principal ray is denoted by the solid line.

Figure 2A:
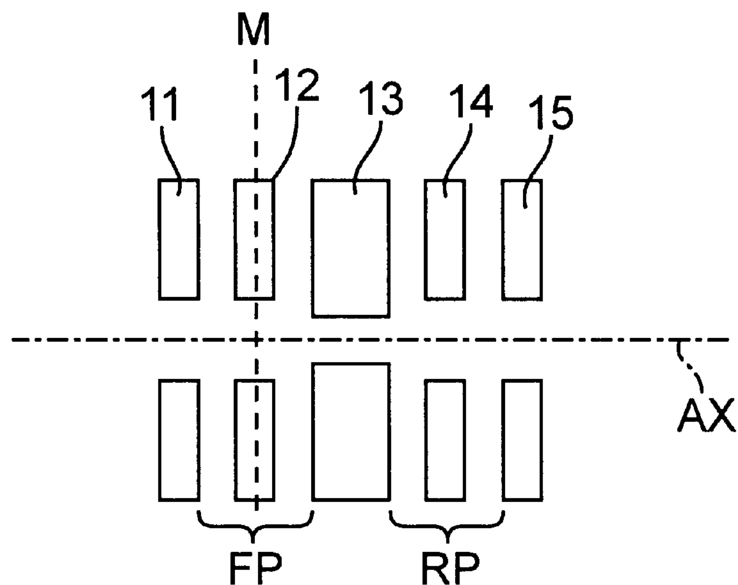
FIGS. 2(*a*)–2(*c*) schematically depict certain details of the projection-optical system of the FIG. 1 embodiment.
Figure 2B:
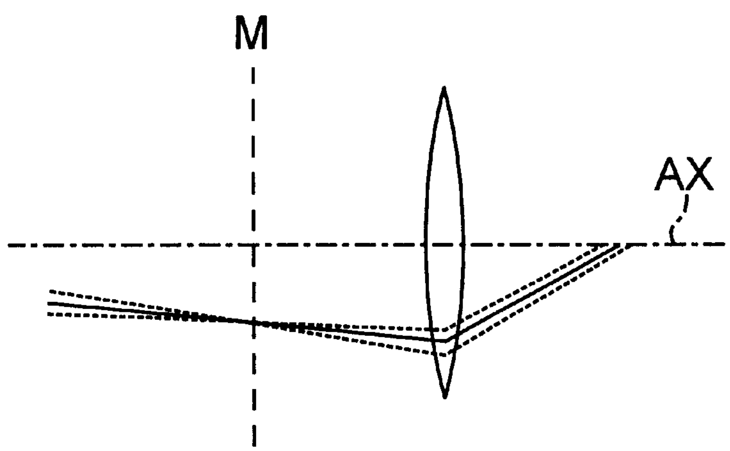
Figure 2C:
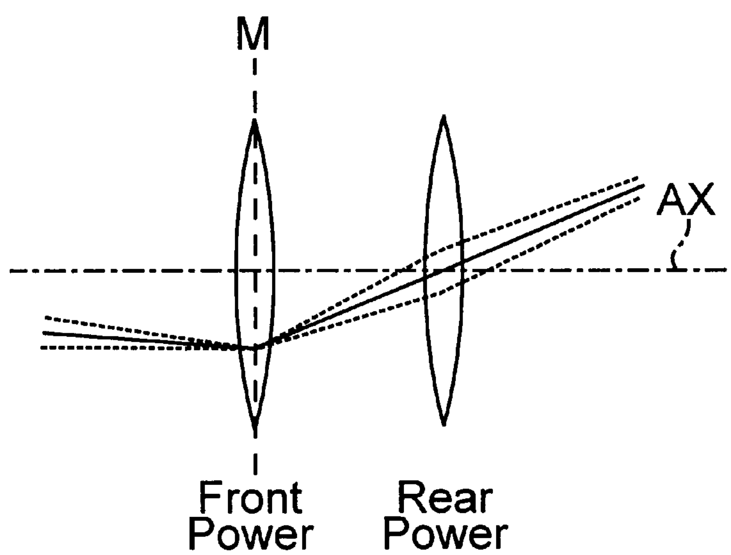

Further details of the projection-optical system 5 according to this embodiment are shown in FIGS. 2(*a*)–2(*c*). FIG. 2(*a*) depicts the disposition of electrodes along the axis AX; FIGS. 2(*b*) and 2(*c*) show equivalent lens systems to certain respective electrodes. The system shown in FIG. 2(*a*) includes a first front electrode 11, a second front electrode 12, a middle electrode 13, a first rear electrode 14, and a second rear electrode 15. In this embodiment, the first front electrode 11, the middle electrode, and the second rear electrode 15 are electrically grounded.

In the FIG. 2(*a*) configuration, the middle electrode 13 is maintained at a constant position along the axis AX. Control of overall lens power is divided between a "front" power FP and a "rear" power RP. The front power FP is controlled by the voltage impressed on the second front electrode 12, while the rear power RP is controlled by the voltage impressed on the first rear electrode 14. The front power RP causes the principal ray to intersect the axis AX near the center of the rear power (FIG. 2(*b*)); hence, the rear power is used to form the final image of the specimen surface 2 on the imaging surface 6. In addition, the cathode lens 3 is adjustable (with respect to power) so that the intermediate imaging plane M can be positioned at the center of the second front electrode 12, i.e., in the center of the front power.

FIG. 2(*b*) shows exemplary ray traces when a front power is not used, wherein the principal ray is denoted by the solid line. The rays shown in the figure converge and form an image at the intermediate imaging plane M. However, at that location, the principal ray (from the specimen surface 2) is incident with a slight divergence. By employing a lens corresponding to the first rear electrode 14, the principal ray intersects the axis to the rear of the center (principal point or nodal point) of that lens (FIG. 2(*b*)). Consequently, pincushion distortion is produced as when a conventional Einzel lens alone is used.

FIG. 2(*c*) shows exemplary ray traces when a controlled voltage also is applied to the second front electrode 12 so that the principal ray intersects the optical axis AX at the center of the lens corresponding to the first rear electrode 14. In this case, since the principal ray passes through at nearly the center of the rear power (i.e., paraxially), the onaxis field of the rear power is used mainly. Hence, distortion is nearly entirely corrected, and coma and transverse chromatic aberration also are reduced.

REPRESENTATIVE EMBODIMENT 2

Figure 3A:
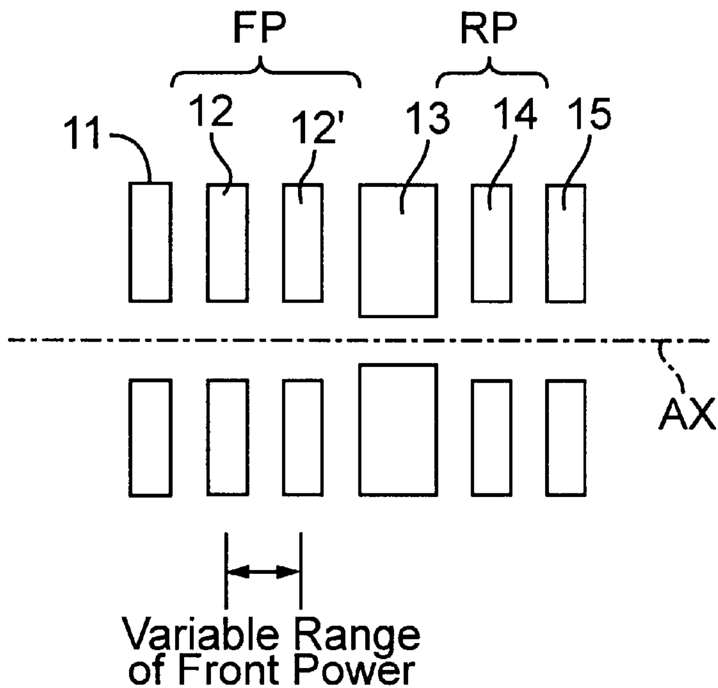
FIGS. 3(*a*)–3(*b*) schematically depict certain details of the projection-optical system of a second representative embodiment of a secondary-electron mapping-projection apparatus according to the invention.
Figure 3B:
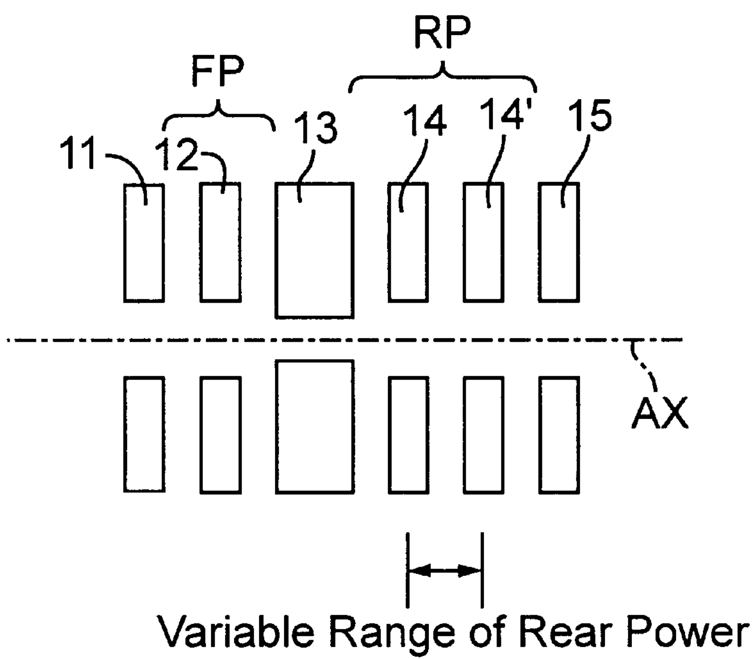

This embodiment of the projection-optical system 5 is shown in FIGS. 3(*a*)–3(*b*). In this embodiment, a third front electrode 12' is added (FIG. 3(*a*)), or a second rear electrode 14' is added (FIG. 3(*b*)). Other components of this embodiment are similar to the corresponding components in the FIG. 2(*a*) embodiment and have the same respective reference numerals.

Referring to FIG. 3(*a*), the respective voltages applied to the second front electrode 12 and the third front electrode 12' desirably are controlled independently. By doing so, the magnitude of the front power FP and the position of the center of the front power FP can be controlled independently. The axial position of the intermediate imaging plane M can be varied by controlling the cathode lens 3 in FIG. 1 to vary the magnification. The principal ray can be made to intersect the optical axis essentially at the center of the rear power RP by aligning the position of the center of the front power FP with the position of the intermediate imaging plane M, and then adjusting the front power FP in the same way as described above in connection with FIGS. 2(*a*)–2(*c*) while maintaining this relationship. Hence, it is possible with this configuration to execute a zooming action that varies the magnification of the image in a continuous manner while minimizing aberrations.

In the configuration shown in FIG. 3(*b*), by independently controlling the voltages impressed on the first rear electrode 14 and the second rear electrode 14', the magnitude of the rear power RP and the position of the center of the rear power RP can be controlled independently. Hence, it is possible with this configuration to execute a zooming action that varies the magnification of the image in a continuous manner while keeping the position of the intermediate imaging plane M constant. In this case, the front power FP also is changed as the center of the rear power RP is shifted so that the principal ray intersects the axis at essentially the center of the rear power. Thus, zooming action can be realized while keeping aberrations low.

REPRESENTATIVE EMBODIMENT 3

Figure 4A:
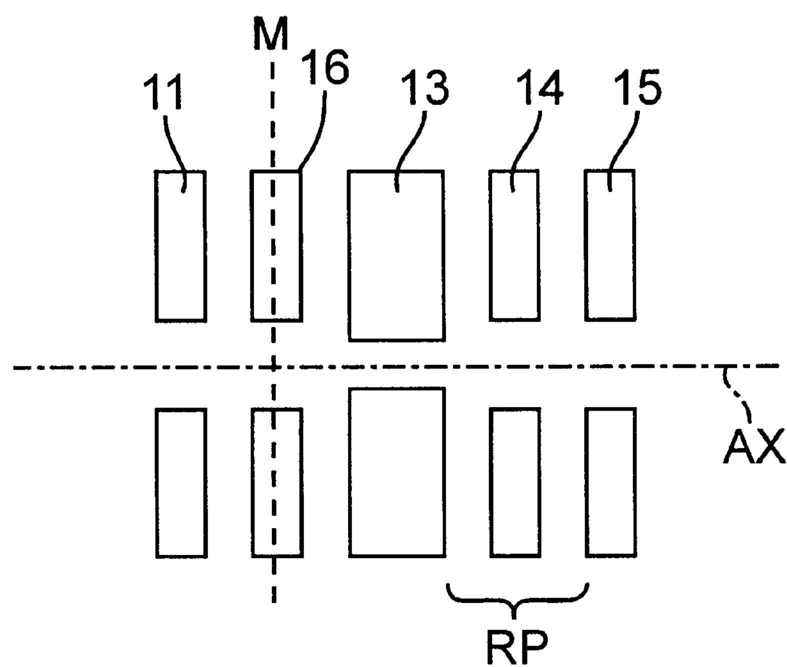
FIGS. 4(*a*)–4(*b*) schematically depict certain details of the projection-optical system of a third representative embodiment of a secondary-electron mapping-projection apparatus according to the invention.
Figure 4B:
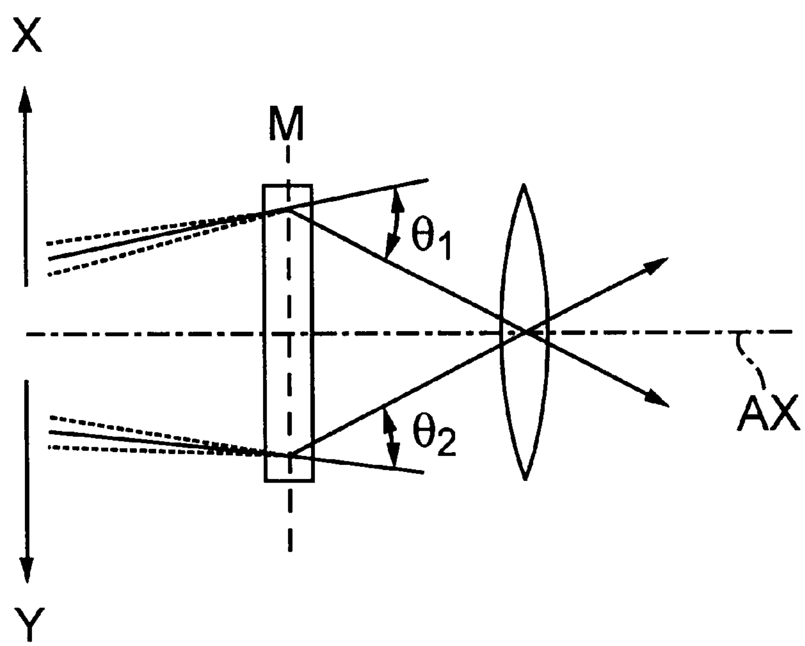

A projection-optical system according to this embodiment is shown in FIGS. 4(*a*)–4(*b*), wherein FIG. 4(*a*) depicts the respective dispositions of the constituent electrodes, and FIG. 4(*b*) depicts the equivalent lens system. Components shown in FIG. 4(*a*) that are the same as respective components in Representative Embodiment 1 have the same respective reference numerals and are not described further. The FIG. 4(*a*) configuration includes a quadrupole electrode 16 (instead of a second front electrode 12) situated between the first front electrode 11 and the middle electrode 13. Between the irradiation source 1 (not shown in FIG. 4(*a*) but see FIG. 1) and the specimen surface 2 is a beam separator (e.g., an ExB, not shown) serving as a "down-lighting" irradiation system for irradiating a specimen 2 with an electron beam. The angle of the principal ray at the intermediate image plane M differs in orthogonal directions of the transverse section of the light flux (termed astigmatism in the pupil space). In other words, in an x-y-z rectangular coordinate system where the optical axis is the z-axis AX, the intermediate imaging plane M is an x-y plane, and the magnetic field of the beam separator is oriented in the direction of the x-axis. Aberration is corrected in the intermediate imaging plane M. As shown in FIG. 4(*b*), the angle of principal rays (solid lines) is different in the x-direction compared to the y-direction. To cause the principal rays to intersect the optical axis at the center of the rear power RP, the principal rays are deflected by the angle $\theta_1$ in the x-direction and by the angle $\theta_2(\theta_{1>\theta 2})$ in the y-direction. In order to accomplish this, respective voltages are impressed on the poles of the quadrupole electrode 16 to create a lens power that is stronger in the x-direction than in the y-direction.

Figure 5:
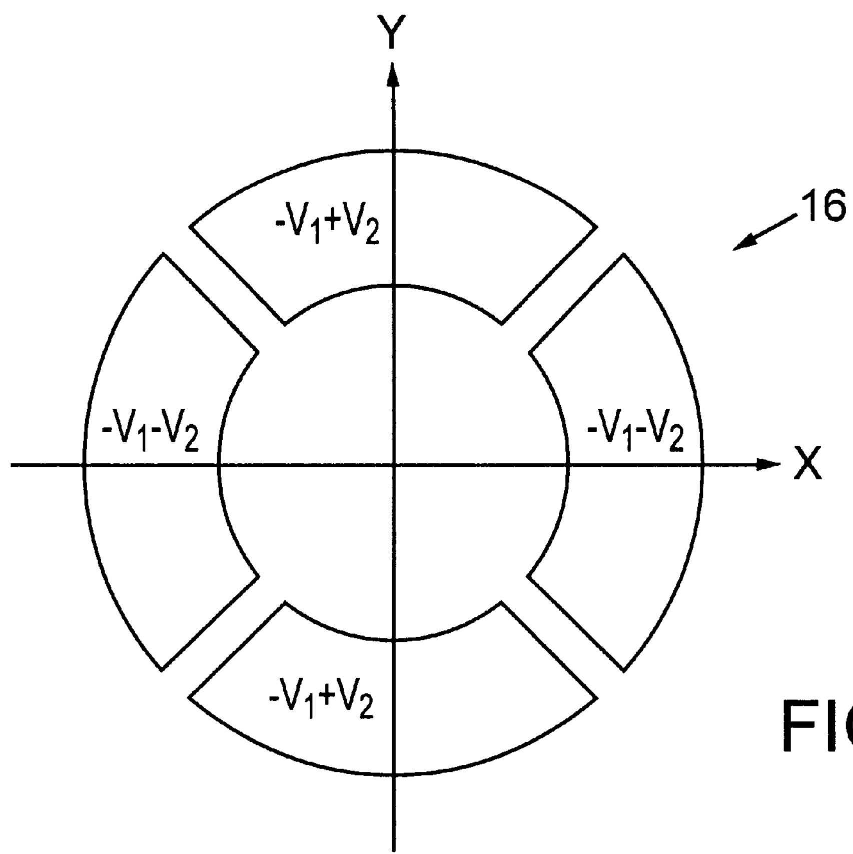
FIG. 5 is a transverse schematic depiction of a quadrupole electrode as used in the FIG. 4(*a*) embodiment, together with an exemplary scheme for impressing voltages on the individual poles of the quadrupole electrode.

A typical voltage-impression scheme for the poles is depicted in FIG. 5. The main voltage $V_1$ and the astigmatism-adjustment voltage $V_2$ ($V_1>V_2>0$) that comprise the overall power are overlapped so that the impressed voltage is greater in the x-direction. As a result, principal rays of different angles collectively can form an image at the center of the rear power with correction of the various aberrations.

REPRESENTATIVE EMBODIMENT 4

Figure 6:
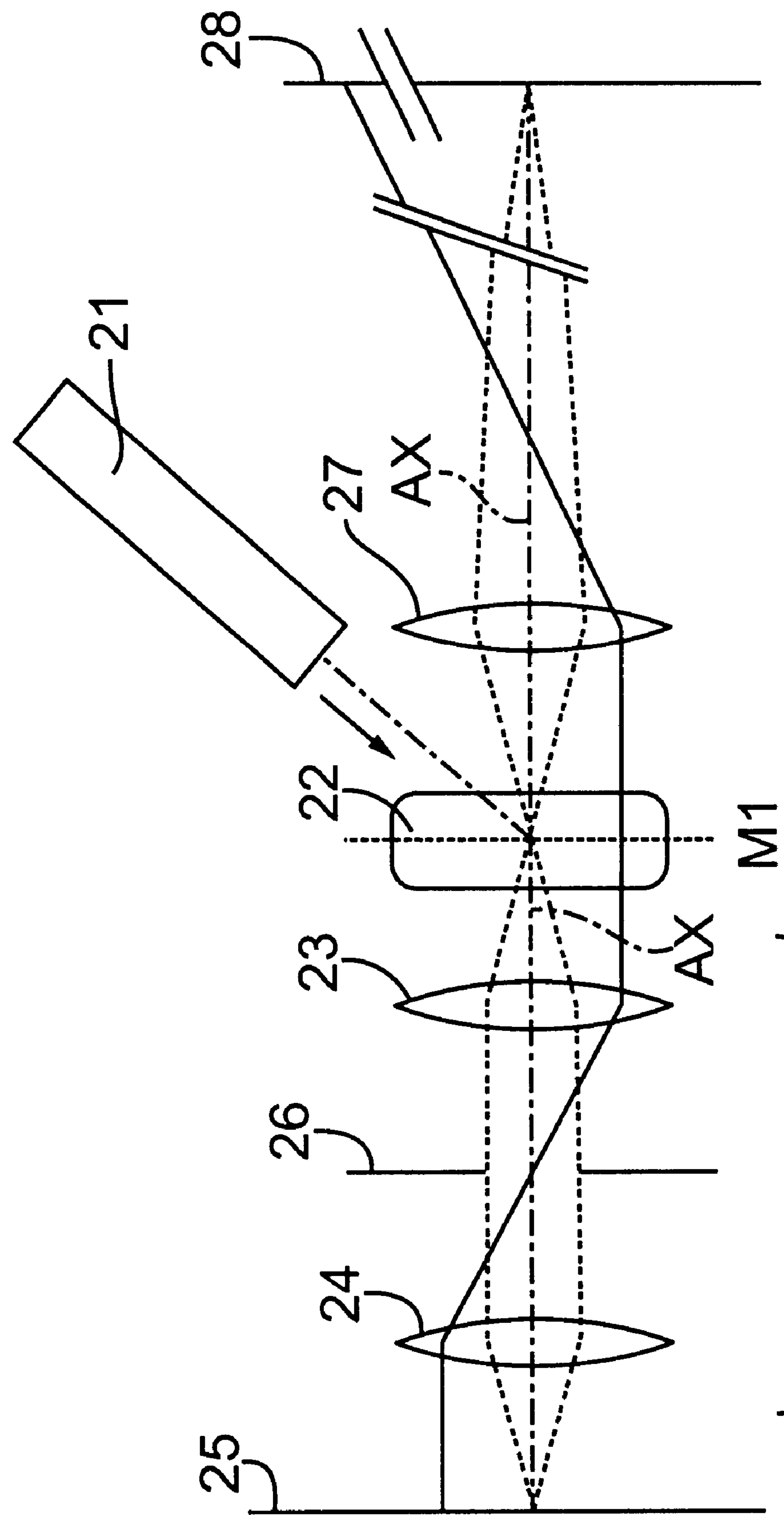
FIG. 6 is a schematic optical diagram of a fourth representative embodiment of a secondary-electron mapping-projection apparatus according to the invention.

A secondary-electron mapping-projection apparatus according to this embodiment is depicted in FIG. 6, and comprises an irradiation column 21, a beam separator (e.g., an ExB) 22, a first front lens 23, a second front lens 24, an aperture 26, a projection lens 27, a detector surface (imaging surface) 28, and an intermediate imaging plane M1.

An electron irradiation beam having a predetermined transverse area and profile is irradiated by the irradiation column 21 at an angle to the optical axis AX. The irradiation beam is directed to the optical center of the beam separator 22 and is deflected by the beam separator 22 so as to propagate along the optical axis AX from the beam separator 22 to a specimen surface 25. The irradiation beam passes through the first front lens 23, the aperture 26, and the second front lens 24 to the specimen surface 25 at which the irradiation beam is perpendicularly incident. Secondary electrons emitted from the specimen surface 25 are formed by the front lenses 23, 24 into an image at the intermediate imaging plane M1 (situated at the optical center of the beam separator 22). The aperture 26 serves to reduce aberrations in the intermediate image.

Figure 9:
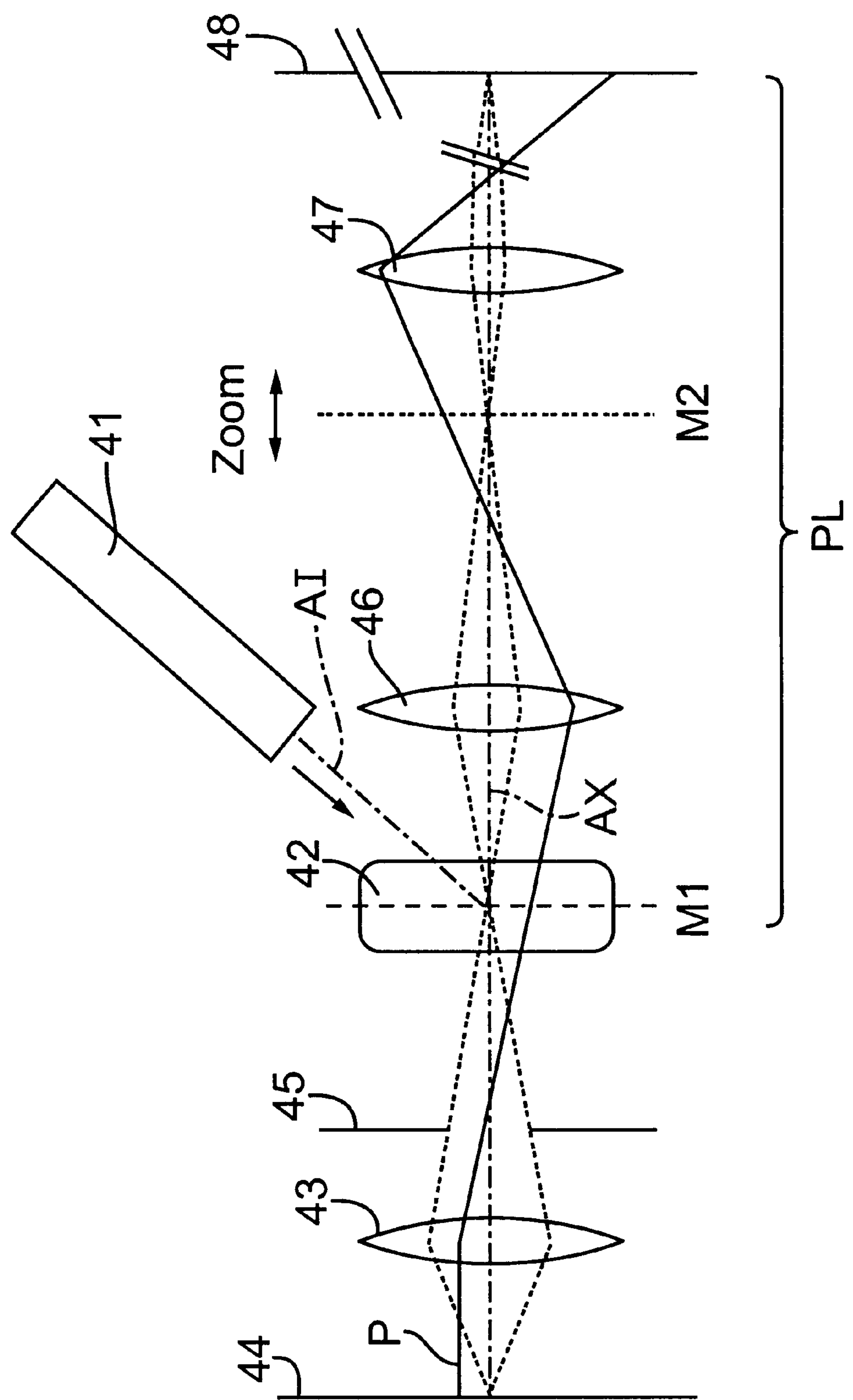
FIG. 9 is a schematic optical diagram of a conventional secondary-electron mapping-projection apparatus.

Unlike the conventional system shown in FIG. 9, the FIG. 6 embodiment has a front lens system, located between the beam separator 22 and the specimen surface 25, that includes a two-stage lens system (first and second front lenses 23, 24, respectively) configured as a bi-directionally telecentric system. In other words, the specimen surface 25 is situated at the forward focal position of the second front lens 24 (note convergence of dotted lines), and the aperture 26 is positioned at the rearward focal position of the second front lens 24 and at the forward focal position of the first front lens 23. The intermediate imaging plane M1 is formed at the rearward focal position of the first front lens 23.

Between the first front lens 23 and the projection lens 27, the principal ray (solid line) is parallel to the optical axis AX and thus does not diverge. As a result, the ray is incident to the projection lens 27 more paraxially (at a point closer to the optical axis AX) than in conventional systems (compare the height of the principal ray passing through the lens 47 (FIG. 9) with the height of the principal ray passing through the lens 27 (FIG. 6)). Consequently, pincushion distortions are suppressed. Also, because the rays that are used for forming an image at the detector surface 28 are closer to being paraxial rays, other aberrations are suppressed as well, even during wide-field, low-magnification imaging.

The image formed at the intermediate imaging plane Ml is enlarged and re-formed on the detector surface 28 by the projection lens 27. The magnification of the image formed on the detector surface 28 is changed by changing the axial position of the projection lens 27. A wide-field, low-magnification image is obtained by reducing the power of the projection lens 27. Typically, the projection lens 27 actually comprises multiple lenses to facilitate making changes in image magnification.

Figure 7:
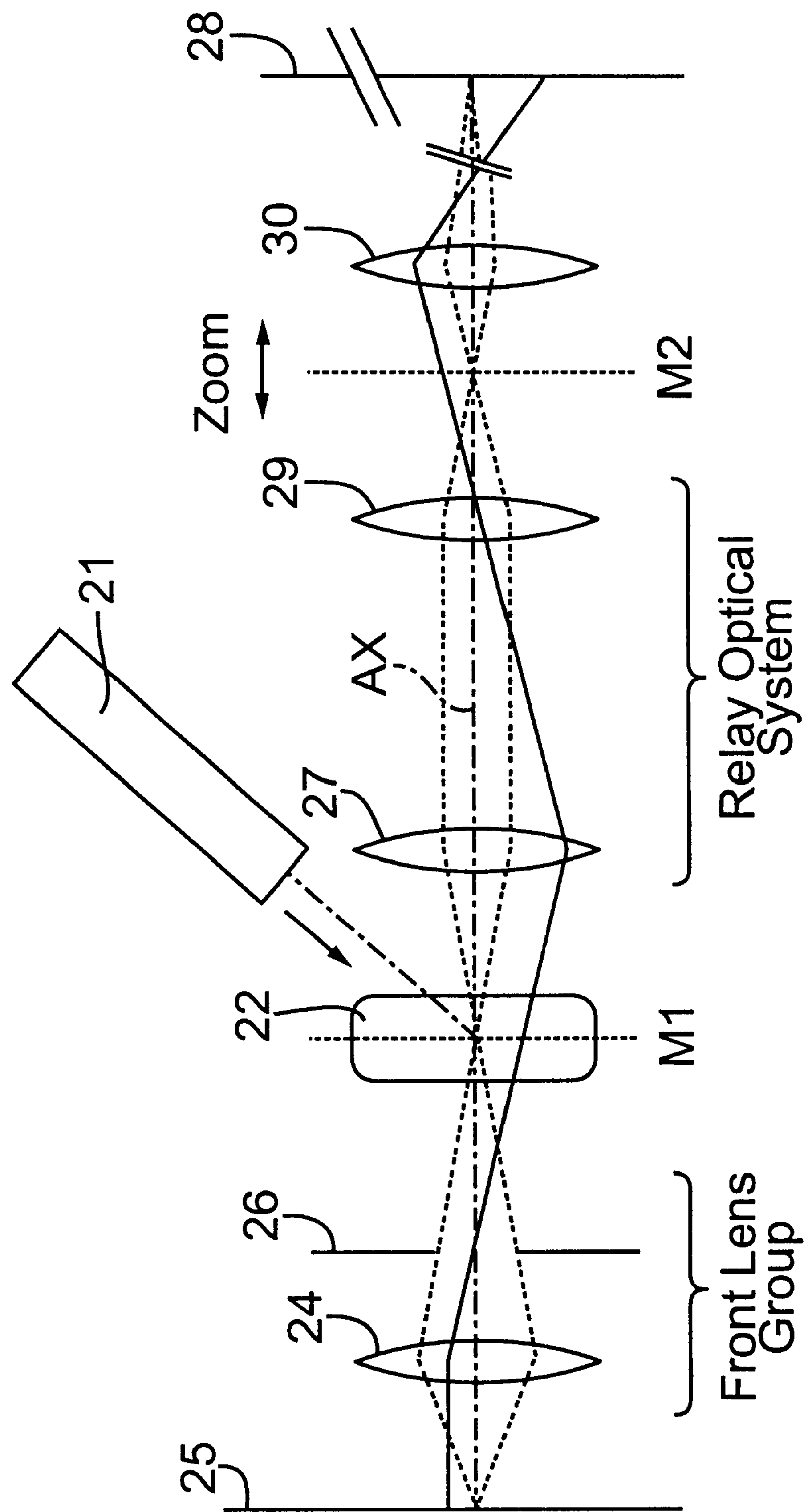
FIG. 7 is a schematic optical diagram of a fifth representative embodiment of a secondary-electron mapping-projection apparatus according to the invention.

This embodiment is shown in FIG. 7, in which components that are similar to corresponding components shown in FIG. 6 have the same respective reference numerals. (It is noted that, in this embodiment, item 27 is termed a "first rear lens" whereas item 27 is termed simply a "projection lens" in FIG. 6.) The FIG. 7 embodiment further comprises a second rear lens 29 and a third rear lens 30. "M2" denotes a second intermediate imaging plane, and "M1" is a first intermediate imaging plane. The respective structures and positions of the irradiation column 21, beam separator 22, aperture 26, and irradiation column 21 are similar to respective structures and positions of corresponding components of the system shown in FIG. 9. The second front lens 24 forms an image, of secondary electrons emitted from the specimen surface 25, at the first intermediate imaging plane M1 located at the optical center of the beam separator 22.

The first rear lens 27 and second rear lens 29 collectively form a relay optical system. The relay optical system forms an image, of the image at the first intermediate imaging plane M1, at the second intermediate imaging plane M2. The image at the second intermediate imaging plane M2 is reformed by the third rear lens 30 on the detector surface 28. The lenses 27, 29, and 30 collectively comprise a projection-optical system.

The relay optical system suppresses divergence of the principal ray (solid line) and thus corrects distortion aberrations. Namely, the principal ray incident to the third rear lens 30 is essentially parallel with the optical axis AX and passes through the third rear lens paraxially (near the optical axis AX). The magnification of the image created by the projection-optical system can be varied in a continuous manner by changing the power balance in the relay optical system. (When the first and second intermediate image planes are fixed, the "power balance" is the respective focal lengths of the lenses 27, 29, relative to each other.) Changing the power balance changes the axial position of the second intermediate imaging plane M2. Image magnification also can be varied by changing the power balance between the relay optical system and the third rear lens 30, or by changing the power of the second rear lens 30. This makes it possible to obtain images at magnifications ranging from wide-field at low magnification to narrow-field at high magnification.

The relay optical system desirably is configured to be bi-directionally telecentric whenever the magnification of the image is small and the optical field is large in the relay optical system (i.e., at the wide-angle end of the zoom range). In such a configuration, the focal point of the first rear lens 27 is set at the position of the first intermediate imaging plane M1, and the focal point of the second rear lens 29 is set at the position of the second intermediate imaging plane M2. With such a configuration, the principal ray is made incident to the third rear lens 30 nearly parallel with the optical axis AX under conditions that otherwise would be susceptible to the generation of excessive distortion aberrations. Thus, this configuration suppresses such distortion aberrations.

REPRESENTATIVE EMBODIMENT 6

Figure 8:
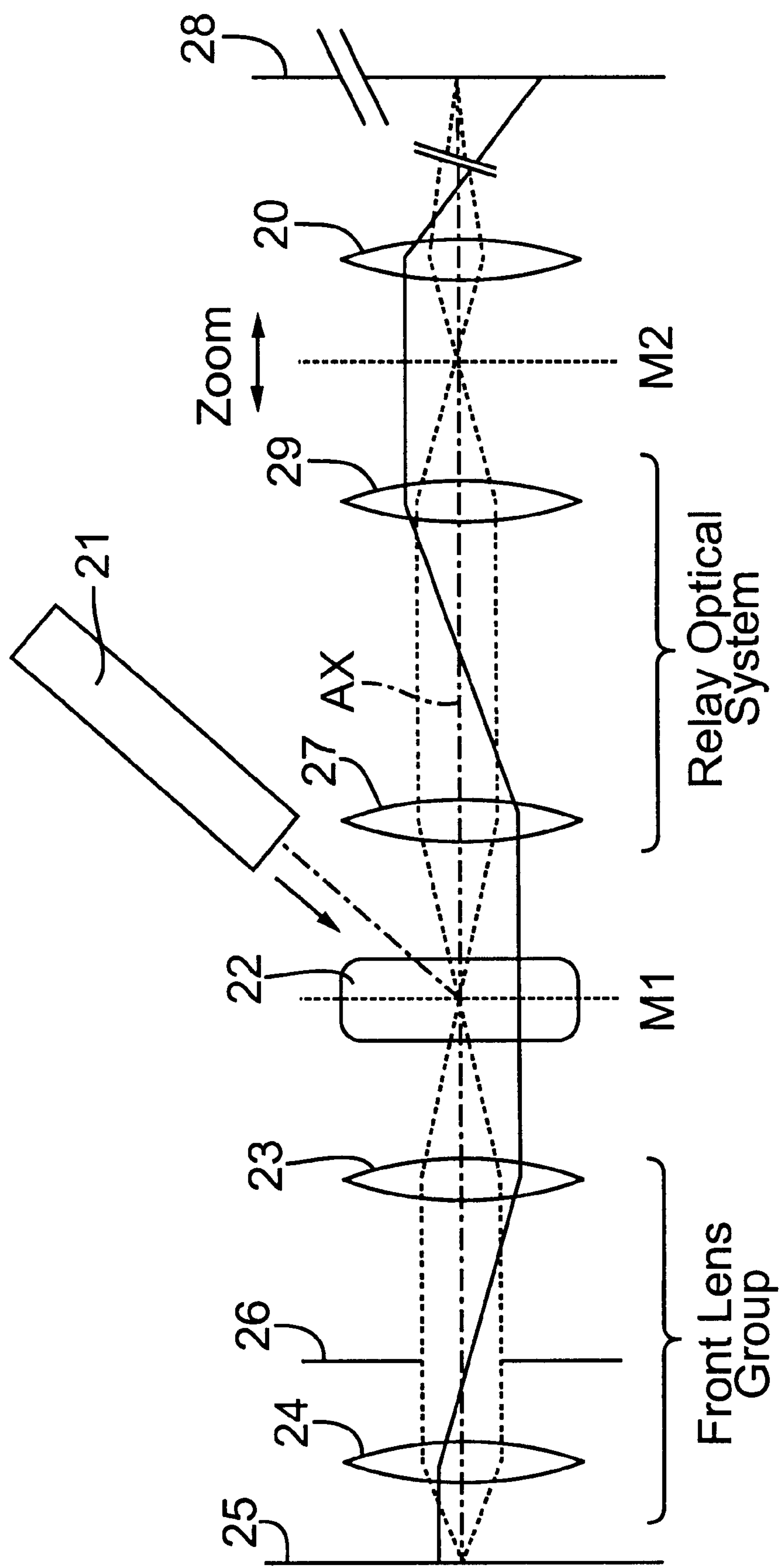
FIG. 8 is a schematic optical diagram of a sixth representative embodiment of a secondary-electron mapping-projection apparatus according to the invention.

This embodiment is depicted in FIG. 8, in which components that are similar to corresponding components in the FIG. 7 embodiment have the same respective reference numerals. In the FIG. 8 embodiment, the optical system ("front optical system") between the beam separator 22 and the specimen surface 25 is similar to the corresponding optical system shown in FIG. 6, and the optical system ("rear optical system" or "projection-optical system") between the beam separator 22 and the detector surface 28 is similar to the corresponding optical system shown in FIG. 7. Hence, the FIG. 8 embodiment has the advantages of both the FIG. 6 embodiment and the FIG. 7 embodiment.

Namely, the front optical system in this embodiment is configured to be bi-directionally telecentric. A principal ray (solid line) passing through the first intermediate imaging plane M1 is parallel to the optical axis AX. The principal ray enters the rear optical system non-divergently and not excessively off-axis. As a result, conditions that otherwise would produce distortion aberrations are not present. In addition, the axial position of the second intermediate imaging plane M2 can be changed by the relay optical system in a continuous manner without causing any divergence of the principal ray. As a result, essentially no distortion aberrations are generated in the rear optical system. If a higher magnification in a narrow field is required than can be achieved by the rear optical system, then the bi-directional telecentricity of the front optical system can be exploited.

Whereas the invention has been described in connection with multiple representative embodiments, it will be apparent that the invention is not limited to those embodiments. On the contrary, the invention is intended to encompass all modifications, alternatives, and equivalents as may be included within the spirit and scope of the invention, as defined by the appended claims.

What is claimed is:

1. In a secondary-electron mapping-projection apparatus, an electrostatic projection-lens system comprising a front-power group and a rear-power group each having a middle electrode in common, the middle electrode and at least one electrode of the front-power group forming a front power, and the middle electrode and at least one electrode of the rear-power group forming a rear power, each of the front and rear powers being independently variable.

2. The projection-lens system of claim 1, wherein:

each of the front and rear powers has a respective center position; and the respective center positions of at least one of the front and rear powers are variable by varying a respective voltage applied to the respective electrode, except the middle electrode.

3. The projection-lens system of claim 2, wherein at least one electrode in the front-power group is configured as a multi-pole electrode including at least four poles.

4. The projection-lens system of claim 1, wherein at least one electrode in the front-power group is configured as a multi-pole electrode including at least four poles.

5. A secondary-electron mapping-projection apparatus, comprising a projection-lens system as recited in claim 1.

6. A secondary-electron mapping-projection apparatus, comprising a projection-lens system as recited in claim 2.

7. A secondary-electron mapping-projection apparatus, comprising a projection-lens system as recited in claim 3.

8. In a method for performing secondary-electron mapping-projection microscopy, a method for producing an image of a specimen surface at a pre-determined magnification, the method comprising:

providing an electrostatic projection-lens system comprising a front-power group and a rear-power group each having a middle electrode in common, the middle electrode and at least one electrode of the front-power group forming a front power, and the middle electrode and at least one electrode of the rear-power group forming a rear power, each of the front and rear powers being independently variable;

irradiating a region of the specimen surface with a charged particle beam so as to cause the specimen surface to emit secondary electrons;

routing the secondary electrons into an end of the projection-lens system; and adjusting at least one of the front power and rear power to obtain an electron-image of the irradiated region of the specimen surface at a desired magnification.

* * * * *

UNITED STATES PATENT AND TRADEMARK OFFICE

CERTIFICATE OF CORRECTION

PATENT NO. : 6,608,308 B1
DATED : August 19, 2003
INVENTOR(S) : Takagi et al.

It is certified that error appears in the above-identified patent and that said Letters Patent is hereby corrected as shown below:

Column 7,
Line 64, "electrons, from" should be -- electrons from --.

Column 8,
Line 13, "bidirectional" should be -- bi-directional --.

Column 12,
Line 4, please insert paragraph title -- REPRESENTATIVE EMBODIMENT 5 --.

Signed and Sealed this

Thirtieth Day of December, 2003

JAMES E. ROGAN
*Director of the United States Patent and Trademark Office*